US009943881B2

(12) United States Patent
Okada et al.

(10) Patent No.: US 9,943,881 B2
(45) Date of Patent: Apr. 17, 2018

(54) ULTRASOUND PROBE

(71) Applicant: Toshiba Medical Systems Corporation, Otawara-shi (JP)

(72) Inventors: Kengo Okada, Nasushiobara (JP); Minoru Aoki, Yaita (JP); Hiroyuki Shikata, Nasushiobara (JP); Takashi Kubota, Otawara (JP); Yasuhiro Ona, Nasushiobara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 484 days.

(21) Appl. No.: 14/618,615

(22) Filed: Feb. 10, 2015

(65) Prior Publication Data

US 2015/0251219 A1 Sep. 10, 2015

(30) Foreign Application Priority Data

Feb. 10, 2014 (JP) ................................ 2014-023741

(51) Int. Cl.
*B06B 1/06* (2006.01)
*H01L 41/08* (2006.01)

(52) U.S. Cl.
CPC .................................. *B06B 1/0622* (2013.01)

(58) Field of Classification Search
CPC ................................ A61B 8/14; B06B 1/0622
USPC .......................................................... 310/334
See application file for complete search history.

(56) References Cited

U.S. PATENT DOCUMENTS

| | | | | |
|---|---|---|---|---|
| 4,217,684 A * | 8/1980 | Brisken | B06B 1/0622 | 257/416 |
| 5,886,454 A * | 3/1999 | Ito | B06B 1/0622 | 310/322 |
| 6,278,224 B1 * | 8/2001 | Sawada | B06B 1/0622 | 310/334 |
| 6,308,389 B1 * | 10/2001 | Tezuka | B06B 1/0629 | 264/263 |
| 7,230,368 B2 * | 6/2007 | Lukacs | B06B 1/0622 | 310/334 |
| 8,207,652 B2 * | 6/2012 | Baumgartner | G10K 11/002 | 310/334 |
| 9,180,491 B2 * | 11/2015 | Tsuzuki | B06B 1/0629 | |
| 2005/0043624 A1 * | 2/2005 | Oliver | A61B 8/12 | 600/459 |
| 2005/0275313 A1 * | 12/2005 | Yamashita | B06B 1/0622 | 310/327 |

(Continued)

*Primary Examiner* — J. San Martin
(74) *Attorney, Agent, or Firm* — Oblon, McClelland, Maier & Neustadt, L.L.P.

(57) ABSTRACT

An ultrasound transducer includes an electric vibrator including a vibrator contact layer, to transmit and receive ultrasound wave, and a circuit-board including a circuit contact layer connected to the vibrator contact layer, to transmit and receive ultrasound signals via the vibrator contact layer. A maximum width which width is an extent of a shorter side of the circuit contact layer, is same to a width of the electric vibrator. The circuit contact layer includes a bonding area that extends to a surface of a circuit-board and a surface of the vibrator contact layer. An adhesive is provided in the bonding area to adhere the electric vibrator and the circuit-board to each other.

9 Claims, 11 Drawing Sheets

(56) References Cited

U.S. PATENT DOCUMENTS

| | | | | |
|---|---|---|---|---|
| 2011/0316387 | A1* | 12/2011 | Togasaki | B06B 1/0622 310/334 |
| 2013/0315035 | A1* | 11/2013 | Tai | B06B 1/0622 367/140 |

* cited by examiner

BACKGROUND ART

BACKGROUND ART

Cross-section View

BACKGROUND ART

Cross-section View

ULTRASOUND PROBE

CROSS-REFERENCE TO RELATED APPLICATIONS

This application is based upon and claims the benefit of priority from prior Japanese Patent Application No. 2014-23741, filed Feb. 10, 2014, the entire contents of which are incorporated herein by reference.

BACKGROUND

1. Field

The present embodiments relate to an ultrasound probe for transmitting and receiving ultrasound waves toward a body of a test subject.

2. Description of the Related Art

An ultrasound scanner plays an important role in medical-diagnosis, because of benefits of an ultrasound scanner such as being smaller than other medical scanners such as an X-ray scanner, an X-ray computed tomography scanner, and a magnetic resonance image scanner. An operator of the ultrasound scanner can also get real-time images from the test-subject such as a beating heart and a moving infant inside a mother's belly, by a simple operation of touching the test subject with the ultrasound probe. Due to the compactness of the ultrasound scanner, it is popular to use at a patient's home. Moreover, the ultrasound scanner can generate medical images without X-ray radiations, and thus can be applied to an obstetric test.

An ultrasound scanner includes an ultrasound probe which transmits and receives ultrasound waves toward the test-subject. When the ultrasound probe transmits the ultrasound waves, the ultrasound waves reflect at a border between two tissues that have different acoustic impedance parameters. The ultrasound probe receives the reflected ultrasound waves from the test-subject, and generates received signals. To transmit and receive the ultrasound waves, electric vibrators are implemented in the ultrasound probe, and the electric vibrators are arranged in a scan-direction. The ultrasound probe also includes a matching layer and an acoustic lens, on a side of the test subject of the electric vibrators. The matching layer averages differences of the acoustic impedance between the electric vibrators and the tissue of the test-subject. The acoustic lens focuses the ultrasound waves from the electric vibrators.

The ultrasound probe further includes a circuit-board and a backing layer, on the other side of the test subject of the electric vibrators. The circuit-board transmits electric signals to the electric vibrators for transmitting the ultrasound waves, and receives electric signals from the electric vibrators. The backing layer absorbs the ultrasound waves transmitted by the electric vibrators in an opposite direction of the test-subject. According to the general ultrasound probe, the electric vibrators and the circuit-board are bonded with adhesive, and electrically connected. The present inventors have recognized in the general ultrasound probe strength of bonding between the electric vibrators and the circuit-board may not be enough.

BRIEF SUMMARY

The present embodiments have been made in consideration of the above situation, and provide an ultrasound probe that can bond the electric vibrator with the circuit-board more strongly.

An ultrasound transducer includes an electric vibrator including a vibrator contact layer, to transmit and receive ultrasound wave, and a circuit-board including a circuit contact layer connected to the vibrator contact layer, to transmit and receive ultrasound signals via the vibrator contact layer. A maximum width which width is an extent of a shorter side of the circuit contact layer, is same to a width of the electric vibrator. The circuit contact layer includes a bonding area that extends to a surface of a circuit-board and a surface of the vibrator contact layer. An adhesive is provided in the bonding area to adhere the electric vibrator and the circuit-board to each other.

DETAILED DESCRIPTION

Figure 1:
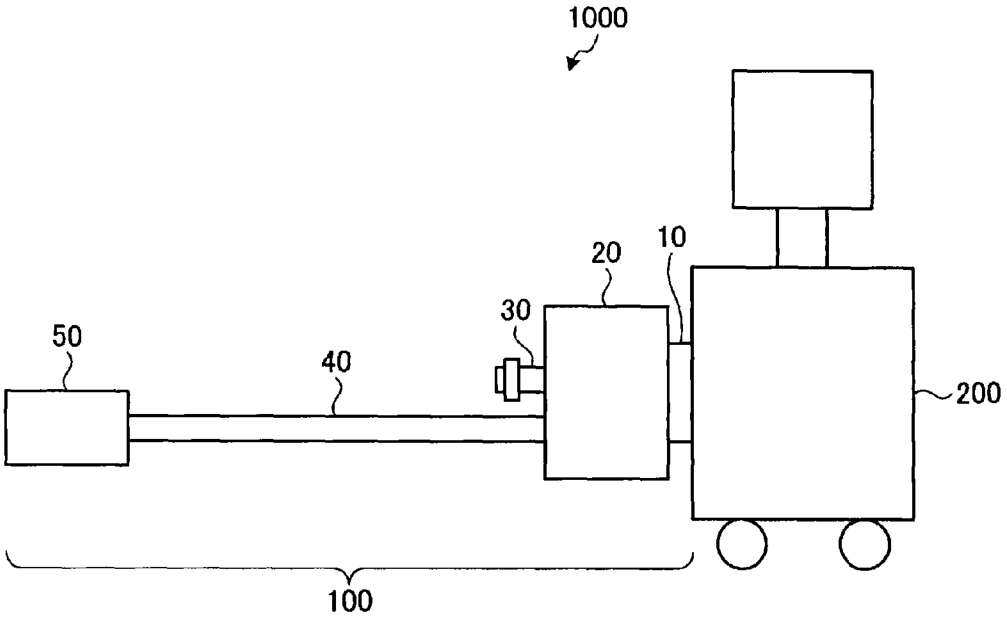
FIG. 1 is a diagram of an ultrasound scanner with an ultrasound probe according to a first embodiment.

A first embodiment of the present invention will be described below with reference to FIG. 1. FIG. 1 is a block diagram of an ultrasound scanner 1000 and an ultrasound probe 100 which is connected to the ultrasound scanner 1000. As shown in FIG. 1, the ultrasound scanner 1000 includes a body 200 and the ultrasound probe 100.

The body 200 sends command-signals to the ultrasound probe 100, for transmitting ultrasound waves to a test-subject from the ultrasound probe 100. The body 200 receives image-signals from the ultrasound probe 100, and generates ultrasound images based on the image-signals. The body 200 includes a display-monitor and an input device. The body 200 displays information and the ultrasound images based on inputs from an operator.

The input device can include various devices such as a track-ball, a dip-switch, input buttons, a mouse, and a keyboard. The operator operates the input device, to send scan-parameters to the body 200.

The display-monitor shows a GUI (Graphical User Interface) for setting the scan-parameters. The display-monitor displays the ultrasound images generated by the body 200.

As shown in FIG. 1, the ultrasound probe 100 includes a contact-terminal 10, a connector 20, a joint mechanism 30, a cable 40, and a transducer-head 50. The contact-terminal 10 receives command-signals from the body 200, and sends them to the transducer-head 50. The contact-terminal 10 receives image-signals from the transducer-head 50, and sends them to the body 200. The contact-terminal 10 includes metal contacts to connect electrically with the body 200, and a form of the metal contacts can be varied to fit the body 200.

The connector 20 connects the contact-terminal 10 and the cable 40. The connector 20 includes the joint mechanism 30 to fix the connector 20 to the body 200. When the connector 20 is fixed to the body 200 by the joint mechanism 30, the contact-terminal 10 connects with the body 200 electrically. The joint mechanism 30 includes a rotating pad and a handle. The rotating pad rotates when the handle is operated. When the rotating pad is inserted to the body 200, the rotating pad can switch a lock-condition in which the connector 20 is fixed to the body 200, and an unlock-condition in which the connector 20 can be removed from the body 200, by its rotation.

The cable 40 connects the connector 20 and the transducer-head 50 electrically. The cable 40 includes a plurality of signal-lines, and the signal-lines connect the transducer-head 50 and the body 200 via the contact-terminal 10. A number of signal-lines corresponds to a number of electric vibrators inside the transducer-head 50.

Figure 2:
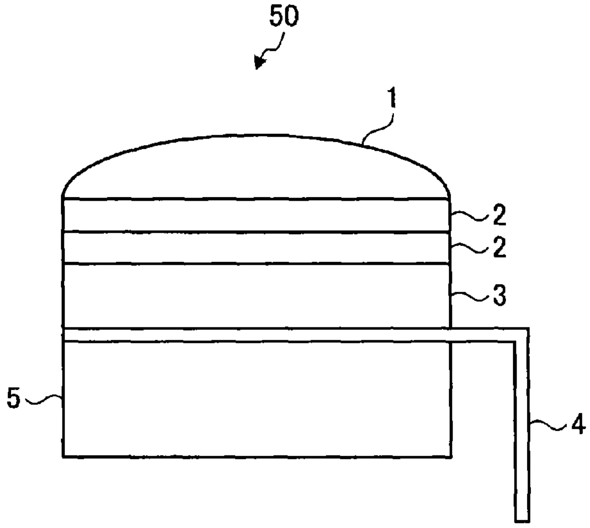
FIG. 2 is a cross-section diagram of electric vibrators, an acoustic lens, matching layers, a circuit-board, and a backing layer according to the first embodiment.

The transducer-head 50 transmits ultrasound waves based on transmitting signals from the body 200. The transducer-head 50 generates received signals based on the received ultrasound waves from the test-subject, and sends the received signals to the body 200. FIG. 2 shows a cross-section diagram of the transducer-head 50.

As shown in FIG. 2, the transducer-head 50 includes an acoustic lens 1, matching layers 2, an electric vibrator 3, a circuit-board 4, and a backing layer 5. For example, the electric vibrator 3 is made out of PZT (lead zirconate titanate ($Pb[Zr(x)Ti(1-x)]O_3$)) and the electric vibrator 3 can call as a piezoelectric element, and the circuit-board 4 is made out of FPC (Flexible Printed Circuits).

The acoustic lens 1 focus the ultrasound waves from the electric vibrator 3. The matching layers 2 average differences of acoustic impedance between the electric vibrator 3 and the acoustic lens 1. The circuit-board 4 transmits transmitting signals to the electric vibrator 3, and receives received signals from the electric vibrator 3. The circuit-board 4 connects to the signal-lines of the cable 40.

The electric vibrator 3 vibrates and transmits the ultrasound waves based on the transmitting signals from the body 200 via the circuit-board 4. The electric vibrator 3 vibrates when it receives the ultrasound waves, and generates the received signals. Then the electric vibrator 3 sends the received signals to the body 200 via the circuit-board 4. The electric vibrator 3 includes a plurality of vibrator-cells (not illustrated), each of the vibrator-cells transmitting and receiving the ultrasound signals. The backing layer 5 absorbs the ultrasound waves transmitted by the electric vibrators 3 in an opposite direction of the test-subject. A middle layer (not illustrated) could also be implemented between the electric vibrators 3 and the circuit-board 4, that middle layer absorbing scattered ultrasound from the electric vibrator 3.

When the electric vibrator 3 transmits the ultrasound waves to the test-subject, the ultrasound waves reflect at a border between two tissues that have different acoustic impedance parameters. The reflected ultrasound waves are received by the electric vibrator 3, and the electric vibrator 3 converts the received ultrasound waves into the received signals. An amplitude of the reflected ultrasound waves are related to differences of the acoustic impedance parameters. When the ultrasound waves are reflected at a moving target such as blood vessels and beating heart-tissues, a frequency of the reflected ultrasound waves is shifted by the Doppler effect.

The embodiments can be applied to a 1-D ultrasound probe that has the vibrator cells arranged in one direction, and can be applied to a mechanical 1-D ultrasound probe that has the vibrator cells arranged in one direction, and the vibrator cells are swung by an attached motor. Also, the embodiments can be applied to a 2-D ultrasound probe that has the vibrator cells arranged in two directions.

Figure 3:
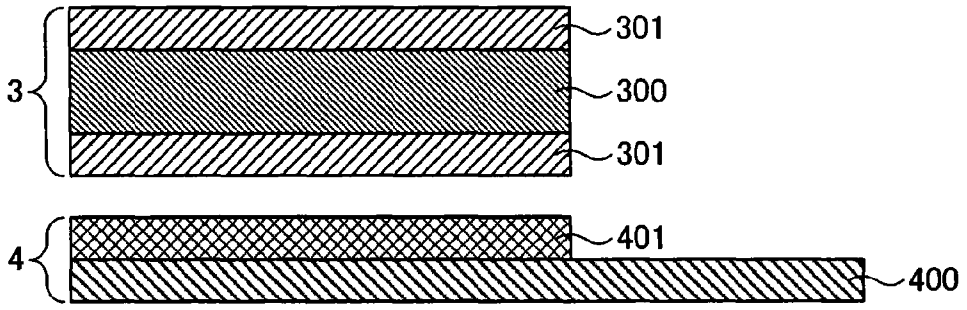
FIG. 3 is a close-up cross-section diagram of the electric vibrators and the circuit-board according to the first embodiment.

As described above, the electric vibrator 3 transmits and receives electric signals to/from the circuit-board 4. In the first embodiment, the strength of bonding of the electric vibrator 3 with the circuit-board 4 is improved. FIG. 3 shows a close-up cross-section diagram of the electric vibrators 3 with the circuit-board 4, and contact-layers 301, according to the first embodiment.

As shown in FIG. 3, the electric vibrator 3 includes a vibrating layer 300 and vibrator contact layers 301. The vibrator contact layers 301 are attached to an upper surface and a lower surface of the vibrating layer 300. The vibrator contact layers 301 transmit and receive voltage-signals with the vibrating layer 300. The vibrating contact layer 301 of the upper-surface acts as a ground-contact, and the vibrating contact layer 301 of the lower-surface acts as a signal-contact. The upper-surface and the lower-surface can be switched. In general, the vibrator contact layers 301 can be made of gold.

The circuit-board 4 includes a circuit contact layer 401 and a base layer 400. The base layer 400 supports a structure of the circuit contact layer 401, and can be made of a polyimide resin. The circuit contact layer 401 can be made of copper or gold.

According to the ultrasound probe shown in FIG. 3, the vibrator contact layer 301 is bonded to the circuit contact layer 401 with an adhesive. The electric vibrator 3 can transmit and receive the ultrasound waves via the connected circuit contact layer 401. A structure of the circuit contact layer 401 of the ultrasound probe is largely separated into 2 kinds. FIGS. 4A-4D show a top view and a cross-section diagram according to background arts. To explain simply, the ultrasound probe 100 is a 1-D ultrasound probe that has vibrator cells arranged in one direction.

Figure 4A:
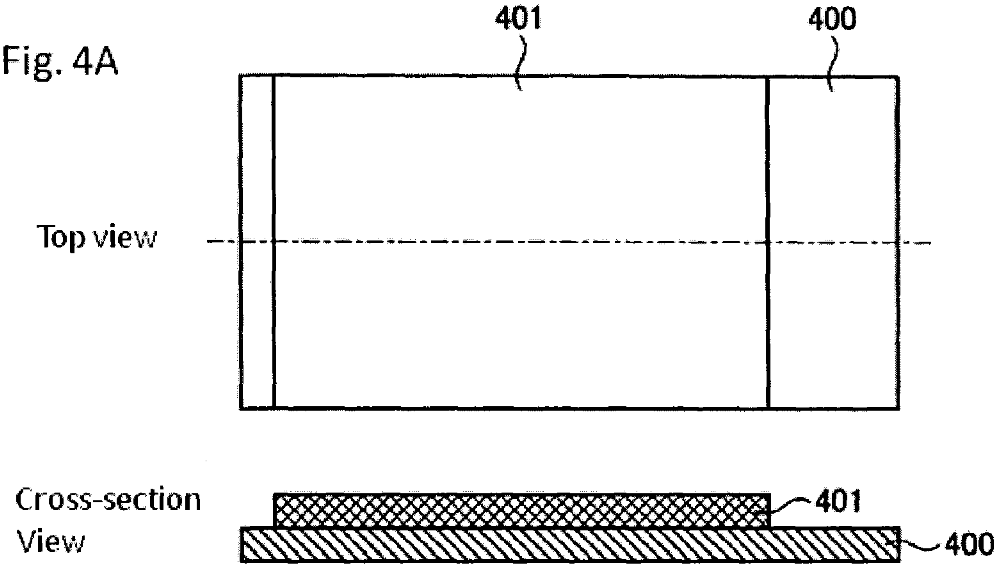
FIGS. 4A-4D are top views and cross-section diagrams of electric vibrators and circuit-board according to background arts.
Figure 4B:
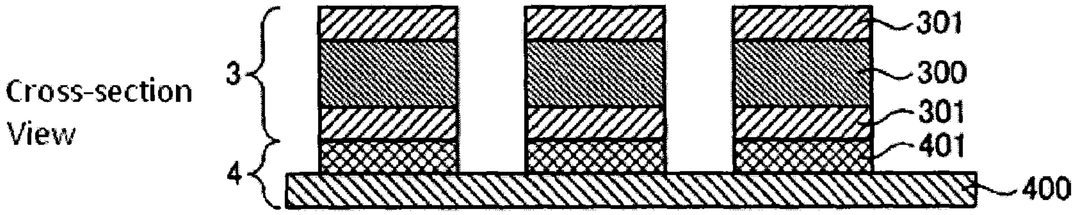

As shown in FIGS. 4A, 4B, the base layer 400 is laminated with the circuit contact layer 401, like a sheet. The electric vibrator 3 is placed on the circuit contact layer 401, and the circuit contact layer 401 is bonded with the vibrator contact layer 301 with the adhesive. After placing the electric vibrator 3 on the circuit contact layer 401, a die cutting procedure is applied to the electric vibrator 3 and the circuit contact layer 401. The bulk electric vibrator 3 is divided into vibrator cells, and the laminated circuit contact layer 401 is also divided. As a result of the die cutting procedure, the separated vibrator cells and the separated circuit contact layer 401 are fixed on the base layer 400. The cross-section diagram of FIG. 4B represents the cross-section at the chain line in the top view of FIG. 4A.

Figure 4C:
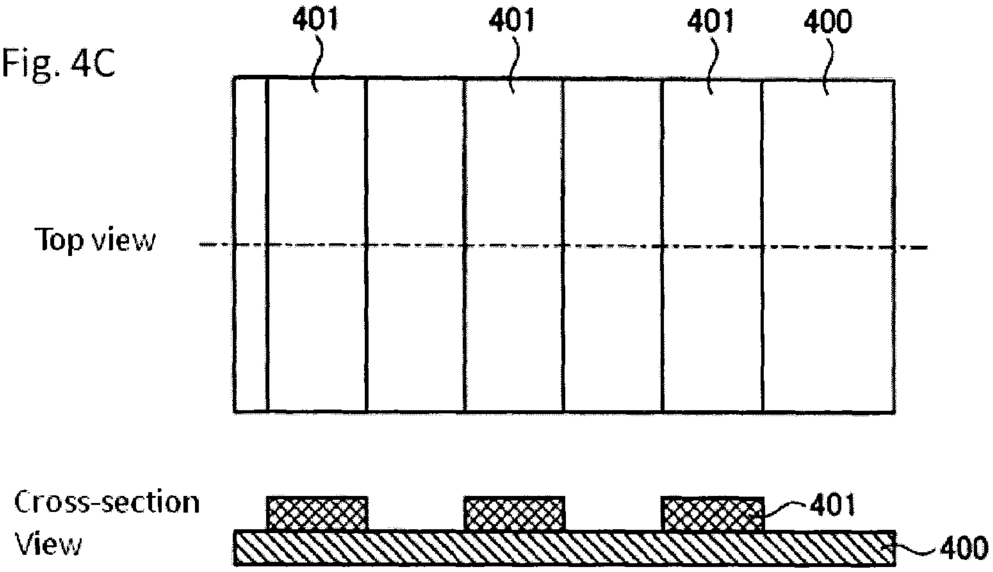
Figure 4D:
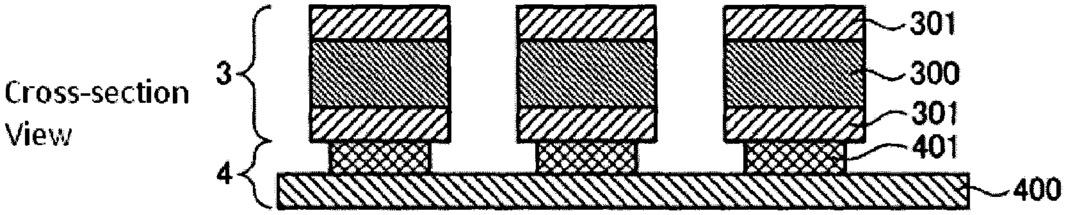

As shown in FIG. 4C, the base layer 400 can have the patterned circuit contact layer 401. In this case, the circuit contact layer 401 is divided according to a size of the vibrator cells, before bonding with the electric vibrator 3. The bulk electric vibrator 3 is placed on the patterned circuit contact layer 401. The patterned circuit contact layer 401 is bonded with the vibrator contact layer 301 with an adhesive. The cross-section diagram of FIG. 4D represents the cross-section at the chain line in the top view of FIG. 4C.

After placing the electric vibrator 3 on the circuit contact layer 401, a die cutting procedure is applied to the electric vibrator 3. The bulk electric vibrator 3 is divided into vibrator cells. In this case, the adhesive flows into an area between the vibrator contact layer 301 and the base layer 400, and the vibrator contact layer 301 and the base layer 400 are bonded in this area.

As described above, in the background art, when the electric vibrator 3 is fixed to the circuit-board 4, the vibrator contact layer 301 and the circuit contact layer 401 are bonded with an adhesive. Both of the layers 301, 401 can be made of gold mainly, and gold has an advantage that is hard to have a chemical reaction and hard to change its character. But gold does not have strong bonding with an epoxy adhesive. If the strength of bonding between the electric vibrator 3 and the circuit-board 4 is not strong, the electric vibrator 3 may peel off from the circuit-board 4 during the die cutting procedure. Also, a characteristic of the electric vibrator 3 may be degraded when the electric vibrator 3 transmits and receives the ultrasound waves by a weak bonding.

According to the background ultrasound probe in FIGS. 4A-4D, it is hard to stably keep the electric vibrator 3 on the circuit-board 4. When the structure in FIGS. 4A, 4B is applied, the vibrator contact layer 301 and the circuit contact layer 401 are bonded with the epoxy adhesive directly. As described above, both layers 301, 401 made out of gold are hard to surely bond to the epoxy adhesive. On the other hand, with the structure in FIGS. 4C, 4D, the adhesive flows into an area between the vibrator contact layer 301 and the base layer 400, and the vibrator contact layer 301 and the base layer 400 are bonded well in this area. But a width of the circuit contact layer 401 is shorter than in the structure of FIGS. 4A, 4B, and the electric vibrator 3 has to be mounted on the smaller circuit contact layer 401. That means, when the electric vibrator 3 is subjected to external force in a lateral direction, the electric vibrator 3 may be slanted on the circuit contact layer 401.

Also, to realize fine ultrasound images, the vibrator cells should have a small width to thereby have a great density of the vibrator cells. For example, when a width of the vibrator cells is shortened, as a result a width of the circuit contact layer 401 may be 50 micrometers. Thereby a width of the circuit contact layer 401 is shortened, and the circuit contact layer 401 may lose an electric connection to the vibrator contact layer 301. If an amount of the adhesive is increased on the electric vibrator 3 and the circuit-board 4, a layer of the increased adhesive may cause degraded characteristics of the transmitted/received ultrasound waves.

As described above, according to the background ultrasound probe, it is hard to stably keep the electric vibrator 3 on the circuit-board 4.

According to the present embodiments, the ultrasound probe 100 has an area where the vibrator contact layer 301 is bonded with a material other than the gold, to adhere the electric vibrator 3 tightly. According to the first embodiment, adhesive is provided at a first bonding area that is between the surface of the vibrator contact layer 301 and the surface of the circuit contact layer 401. And the circuit contact layer 401 has a second bonding area that reaches a surface of the vibrator contact layer 301 and a surface of the base layer 400. For example, the circuit contact layer 401 has a through-hole that reaches a surface of the vibrator contact layer 301 and a surface of the base layer 400, and the through-hole acts as a second bonding area. In this embodiment, the second bonding area added to the first bonding area where the vibrator contact layer 301 is bonded with a material other than the gold is referred to as the second bonding area. For example, the second bonding area might reach a surface of the vibrator contact layer 301 and a surface of the base layer 400, and might reach a surface of the vibrator contact layer 301 and a surface of the backing layer 5.

Figure 5A:
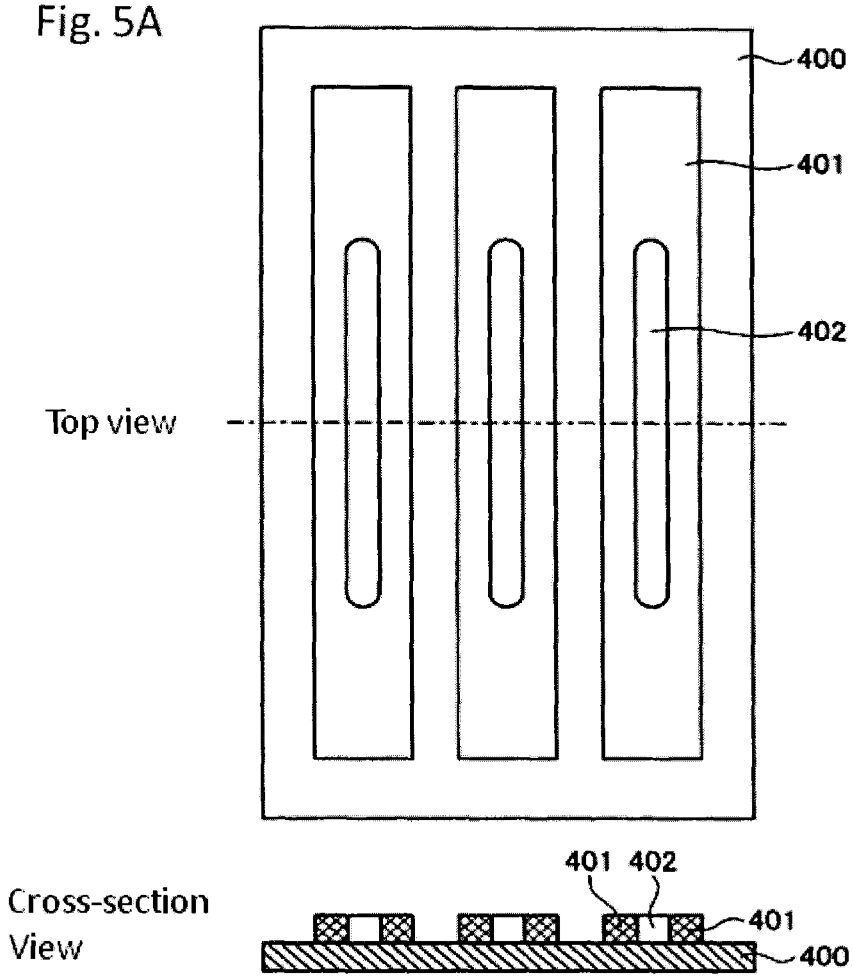
FIGS. 5A, 5B are a top view and a cross-section diagram of the electric vibrators and the circuit-board according to the first embodiment.
Figure 5B:
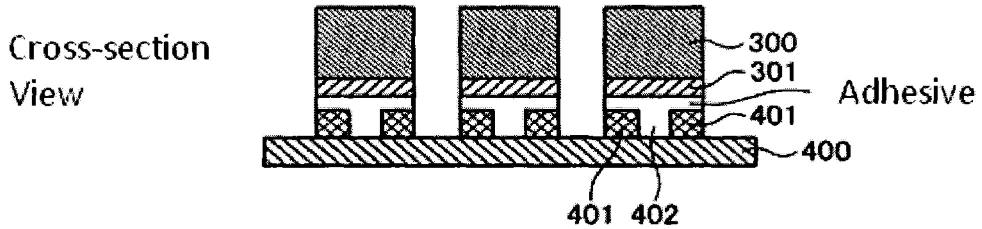

FIGS. 5A, 5B show a structure of the circuit contact layer 401 of the first embodiment. FIG. 5A shows a top view and a cross-section diagram of the circuit-board 4. FIG. 5B shows a cross-section diagram of the circuit-board 4, and the electric vibrator 300 placed on the circuit-board 4. The circuit contact layer 401 has a patterned shape that corresponds to a width of the vibrator contact layer 301. The electric vibrator 300 and the patterned circuit contact layer 401 are arranged in one direction, as an example of this embodiment. The cross-section diagram of FIG. 5B represents the cross-section at the chain line in the top view of FIG. 5A.

As shown in FIG. 5A, the circuit contact layer 401 has a patterned shape that has a predetermined width and pitch. For example, the circuit contact layer 401 has a patterned shape with a 0.1 mm pitch and 0.05 mm width. In this case, the base layer 400 is exposed to an upper layer of the electric vibrator 3 with a 0.05 mm pitch.

As shown in FIG. 5A, the circuit contact layer 401 has a through-hole 402 in a center of the patterned shape. The through-hole 402 reaches a top surface of the base layer 400 and a top surface of the circuit contact layer 401. For example, the through-hole has a 0.02 mm width. When the electric vibrators are bonded with the circuit-board 4, the adhesive flows not only into an area between the circuit contact layer 401 and the vibrator contact layer 301 as the first bonding area, but also into the through-hole 402. In this case, the through-hole 402 acts as the second bonding area.

Figure 6A:
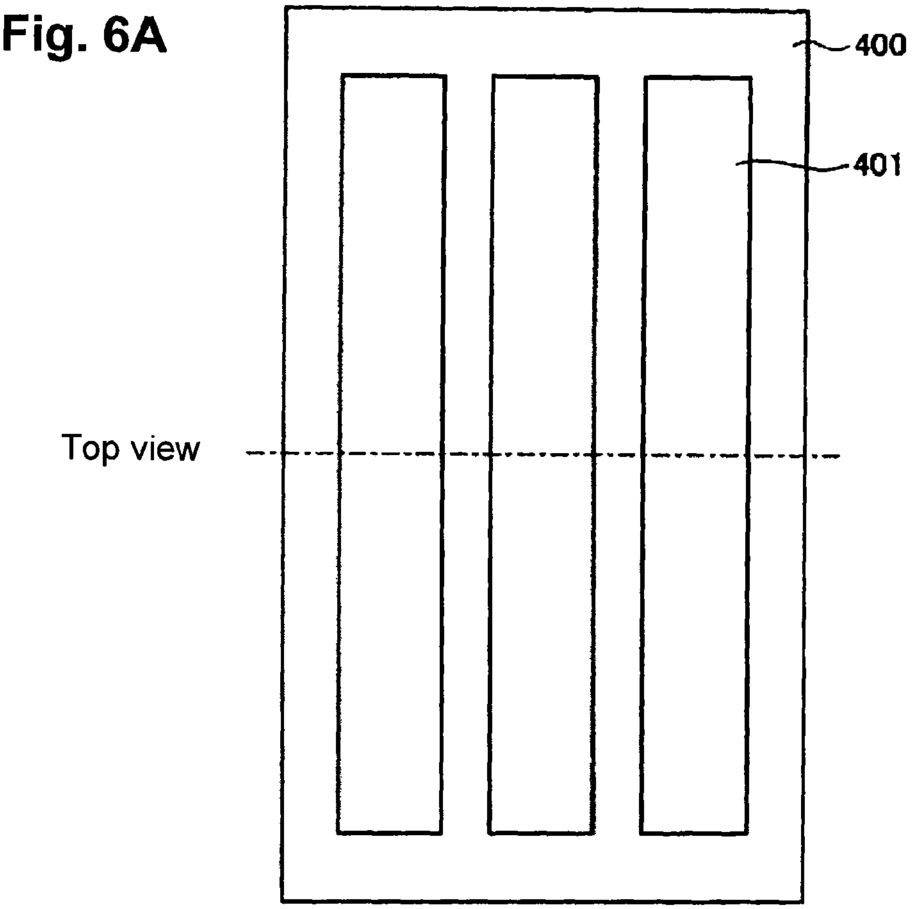
FIGS. 6A, 6B are a top view and a cross-section diagram of electric vibrators and a circuit-board according to a background art.
Figure 6B:
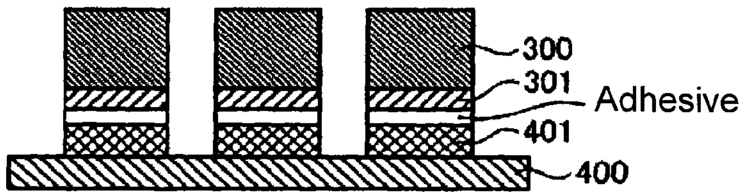

FIGS. 6A, 6B show a structure of the circuit contact layer 401, of a background art. Note that the cross-section diagram of FIG. 6B represents the cross-section at the chain line in the top view of FIG. 6A. As shown in FIGS. 6A, 6B, the circuit contact layer 401 bonds to the vibrator contact layer 301 with the adhesive. In this case, the adhesive flows into an area between the circuit contact layer 401 and the vibrator contact layer 301. But as described above, the adhesive cannot stick well to both layers made out of gold. In comparison with the structure of the first embodiment of FIGS. 5A, 5B, the adhesive that flows into not only the first bonding area but also the second bonding area sticks well to the base layer 400 and the vibrator contact layer 301, to realize more sure bonding compared to FIGS. 6A, 6B as a background art.

Also, in the structure of the first embodiment of FIGS. 5A, 5B, the circuit contact layer 401 has a width corresponding to a width of the electric vibrator 3. Thereby, the electric vibrator 3 can stably be mounted on the circuit contact layer 401. That is, the electric vibrator 3 is less likely to be slanted when the electric vibrator 3 is subjected to an external force in a lateral direction.

The shape of the through-hole 402 can be varied. The shape of through-hole 402 can for example have a polygonal shape, a rectangle shape, a circle shape, and an ellipsoidal shape. Also, the patterned shape of the circuit contact layer 401 can have a plurality of the through-holes 402. For example, two or three through-holes 401 can be implemented in one patterned shape.

Figure 7A:
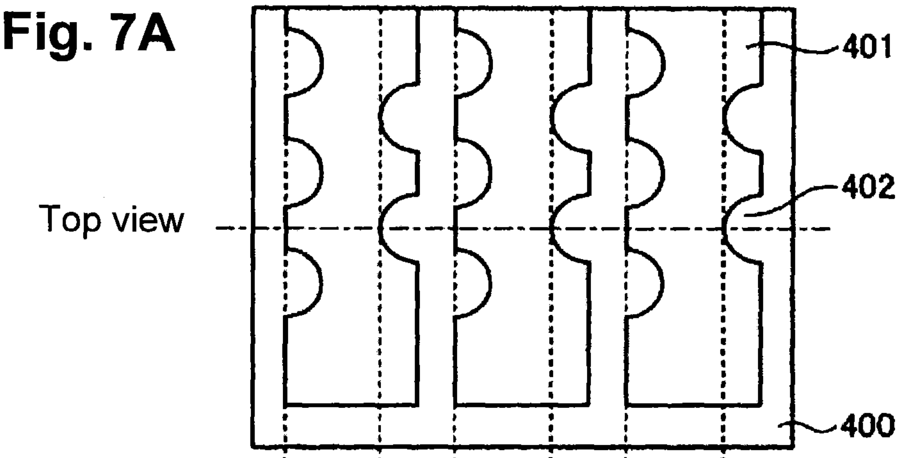
FIGS. 7A, 7B are a top view and a cross-section diagram of electric vibrators and a circuit-board according to a modification of the first embodiment.
Figure 7B:
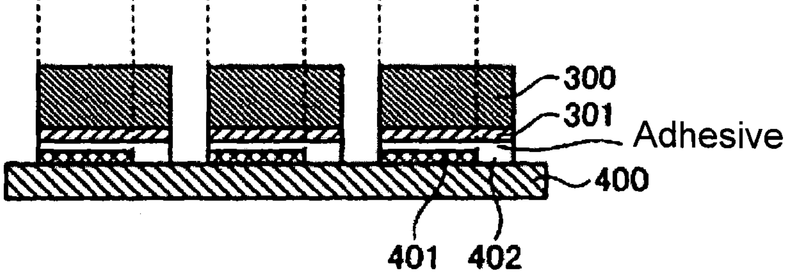

The shape of the second bonding area also can be varied. Instead of implementing the through-hole 402 as the second bonding area, a cleavage implemented at an edge of the circuit contact layer 401 can act as the second bonding area. FIGS. 7A, 7B show another structure of the circuit contact layer 401, as a modification of the first embodiment. FIG. 7A shows a top view and a cross-section diagram of the circuit contact layer 401. The cross-section diagram of FIG. 7B represents the cross-section at the chain line in the top view of FIG. 7A.

As shown in FIGS. 7A, 7B, cleavages shaped like a wave are implemented at opposite sides of the circuit contact layer 401. The cleavages act as the second bonding area, and the cleavages reach the surface of the base layer 400 and the surface of the vibrator contact layer 301. In this case, the adhesive can be provided into the cleavages, and then the adhesive adheres to the base layer 400 and the vibrator contact layer 301 tightly.

Also, as shown in FIGS. 7A, 7B, the cleavages can be placed alternately (have a staggered arrangement) at opposite edges of the circuit contact layer 401. That is, the cleavages at opposite edges need not be placed at a same position, for maintaining a width of the circuit contact layer 401. As shown in FIGS. 7A, 7B, a minimum width of the circuit contact layer 401 is represented by two dashed lines. For example, if the cleavages at opposite edges are placed at a same position, a minimum width of the circuit contact layer 401 is shorter than the structure shown in FIGS. 7A, 7B. Regarding the modified first embodiment of FIGS. 7A, 7B, the circuit contact layer 401 can maintain its width, and avoid a risk of losing electrical connection. Also, regarding the modified first embodiment of FIGS. 7A, 7B, a maximum width of the circuit contact layer 401 corresponds to the electric vibrator 3. The electric vibrator 3 can be mounted on the wide circuit contact layer 401. Thereby, the electric vibrator 3 will not likely be slanted when the electric vibrator 3 is subjected to an external force in a lateral direction.

As described above, regarding to the first embodiment, the circuit contact layer 401 includes the second bonding area that reaches the surface of the base layer 400 and the surface of the vibrator contact layer 301. Thus, the adhesive can be provided into not only the first bonding are but also the second bonding area, and can more surely adhere the circuit-board 4 and the electric vibrator 3.

As described above, the second bonding area can be implemented as a through-hole that reaches surface of the base layer 400 and the surface of the vibrator contact layer 301. Thus, the adhesive can flow into the second bonding area, and can more surely adhere the circuit-board 4 and the electric vibrator 3.

As described above, the second bonding area can also be implemented as cleavages that reach the surface of the base layer 400 and the surface of the vibrator contact layer 301. Thus the adhesive can be provided into the second bonding area, and can more surely adhere the circuit-board 4 and the electric vibrator 3. That structure of the cleavages can be varied. For example, the cleavages can be implemented at an upper-edge and bottom-edge of the circuit contact layer 401 (the cleavages can be implemented at opposite short sides of the circuit contact layer 401). The cleavages could also have a rectangular shape or other polygonal shape.

Figure 8A:
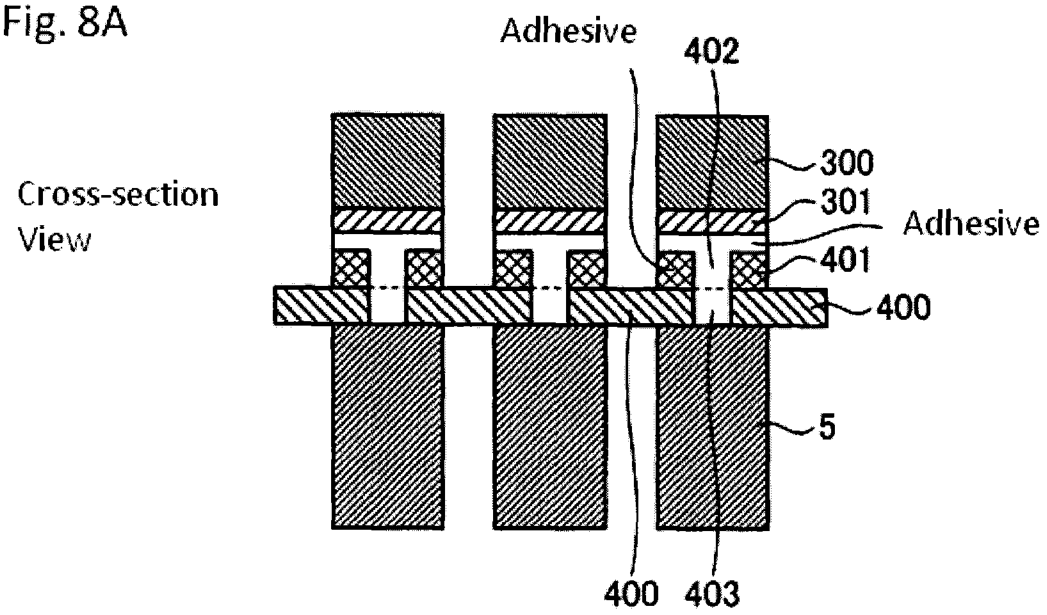
FIGS. 8A, 8B are a cross-section diagram of electric vibrators, a circuit-board, and backing layers according to a second embodiment.
Figure 8B:
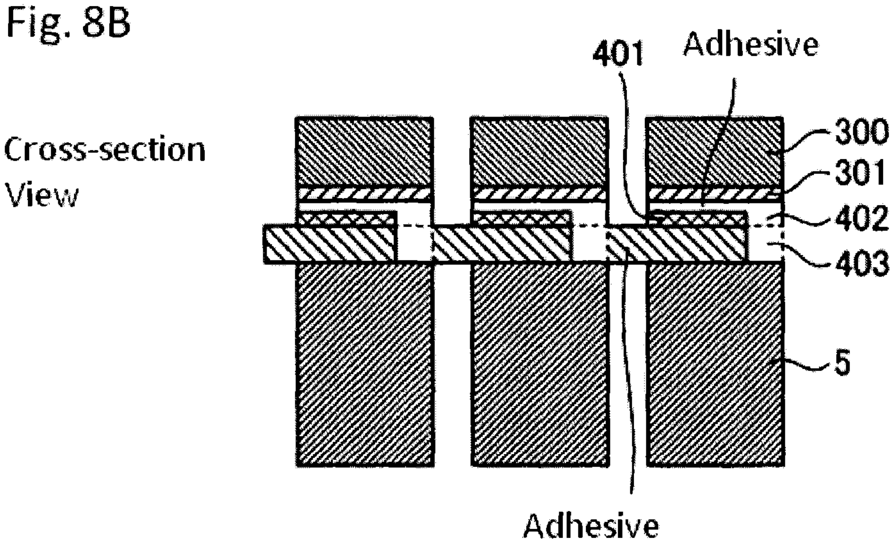

As described in the first embodiment, the second bonding area is implemented at the circuit contact layer 401. In a second embodiment, the second bonding area is implemented at the circuit contact layer 401 and also the base layer 400. In this case, the through-hole or the cleavages that reaches surfaces of the backing layer 5 and the vibrator contact layer 301 act as the second bonding area. FIGS. 8A and 8B show a structure of the circuit contact layer 401 and the base layer 400 of the second embodiment. FIGS. 8A and 8B show a cross-section of the circuit contact layer 401 and the base layer 400. The vibrating layer 300 with the vibrator contact layer 301 is placed on the circuit contact layer 401. The backing layer 5 is attached to the bottom surface of the base layer 400. In FIG. 8A, the through-holes 402 and 403 reach the surface of the backing layer 5 and the surface of the vibrator contact layer 301. In FIG. 8B, the cleavages 402 and 403 reach the surface of the backing layer 5 and the surface of the vibrator contact layer 301.

As shown in FIG. 8A, the through-holes 402 and 403 are placed at a same position. Thus, the adhesive can be provided into the through-holes 402 and 403, and can more surely adhere the surface of the backing layer 5 and the surface of the vibrator contact layer 301.

As shown in FIG. 8B, the cleavages 402 and 403 are placed at the same position. Thus, the adhesive can be provided into the cleavages 402 and 403, and can more surely adhere the surface of the backing layer 5 and the surface of the vibrator contact layer 301.

As shown in FIGS. 8A and 8B, the through-holes and the cleavages are placed at the same position. That is, the adhesive can adhere the electric vibrator 3, the circuit-board 4, and the backing layer 5 at one time, so the ultrasound probe 100 can be built-up much easier. The structure and shape of the through-holes and the cleavages can be varied. For example, the through-hole 402 at the circuit contact layer 401 and the through-hole 403 at the base layer 400 can be off to the side. Or the through-hole 302 or the through-hole 403 can be bigger than the other, and a part of the through-hole 302 and the through-hole 403 overlap each other.

As described above, in the second embodiment, the circuit contact layer 401 and the base layer 400 include the second bonding area that reaches the surface of the backing layer 5 and the surface of the vibrator contact layer 301. Thus, the adhesive can be provided into the second bonding area, and can more surely adhere the electric vibrator 3, the circuit-board 4, and the backing layer 5.

Also, when the second bonding area at the circuit contact layer 401 and the base layer 400 is placed at the same position, the adhesive can adhere the electric vibrator 3, the circuit-board 4, and the backing layer 5 at one time. Thereby the ultrasound probe 100 can be built-up much easier.

Figure 9A:
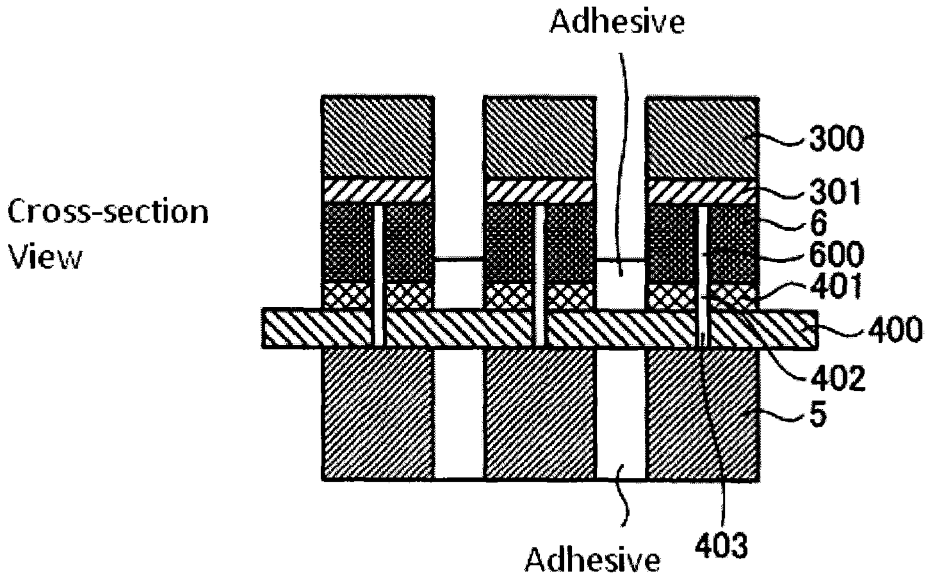
FIGS. 9A, 9B are a cross-section diagram of electric vibrators, a middle layer, a circuit-board, contact-layers, and backing layers according to a third embodiment.
Figure 9B:
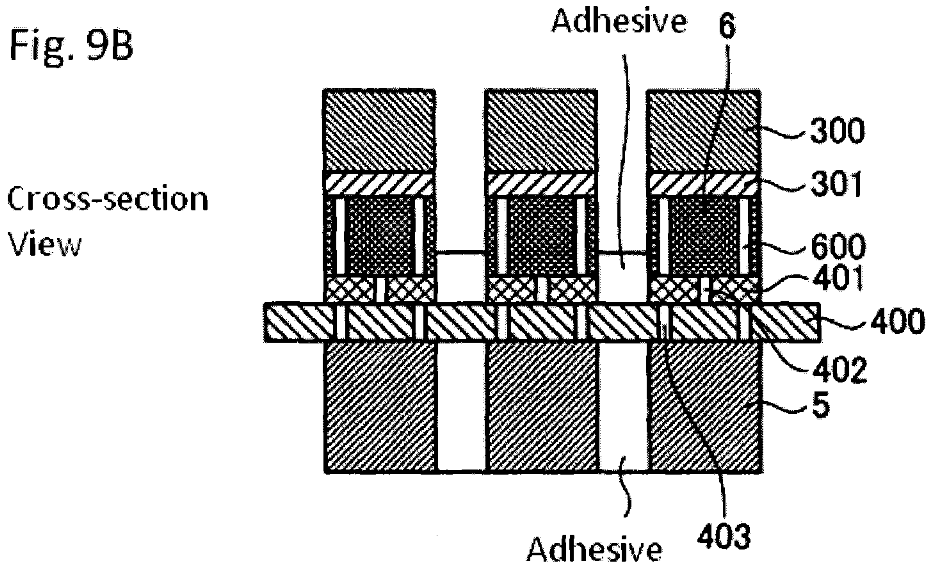

In a third embodiment as shown in FIGS. 9A, 9B, a middle layer 6 is inserted between the electric vibrator 3 and the circuit-board 4. The middle layer 6 has a higher acoustic impedance parameter than the electric vibrator 3, and the middle layer 6 has a thickness of a quarter of wavelength of the ultrasound waves. The middle layer 6 cuts off a certain amount of the ultrasound waves that are scattered and cause noise signals. For example, the middle layer 6 can be made of gold, lead, tungsten, mercury, or sapphire, or a mixture of them.

FIGS. 9A, 9B show the structure of the ultrasound probe 100 with the middle layer 6. FIGS. 9A, 9B show cross-section diagrams of the vibrating layer 300 with the vibrator contact layer 301, the middle layer 6, the base layer 400 with the circuit contact layer 401, and the backing layer 5. In the third embodiment, the through-hole 600 is implemented in the middle layer 6, and the through-hole 402 is implemented in the circuit contact layer 401, and the through-hole 403 is implemented in the base layer 400. The through-holes 402, 403 and 600 act as the second bonding area. The second bonding area reaches the surface of the backing layer 5 and the surface of the vibrator contact layer 301, as shown in FIG. 9A. And as shown in FIG. 9A, the through-holes 402, 403 and 600 are placed at a same position.

As shown in FIG. 9A, the through-hole 600 in the middle layer 6, the through-hole 401 in the circuit contact layer 402, and the through-hole 403 in the base layer 400 are placed at a same position. Thereby, the adhesive can be provided into the through-holes 402, 403 and 600, and more surely adhere the electric vibrator 3, the circuit-board 4, the backing layer 5, and the middle layer 6. Also, the through-holes 402, 403 and 600 are placed at a same position, so the ultrasound probe 100 can be built up much easier.

The structure shown in FIG. 9A is one example of the third embodiment, and the structure of the through-holes and the number of the through-holes can be varied. FIG. 9B shows a modified example of the third embodiment. As shown in FIG. 9B, the through-holes can be added to each layer, and the through-holes of each layer can be off to the side. And size of the through-holes at each layer can be varied. The adhesive can be provided into the through-holes in the same manner as in FIG. 9A, and the adhesive can more surely adhere the electric vibrator 3, the circuit-board 4, the backing layer 5, and the middle layer 6.

As described above, in the third embodiment, the circuit contact layer 401, the middle layer 6, and the base layer 400 include the second bonding area that reaches the surface of the backing layer 5 and the surface of the vibrator contact layer 301. Thus, the adhesive can be provided into the further bonding area, and can more surely adhere the electric vibrator 3, the circuit-board 4, the backing layer 5, and the middle layer 6.

Also, when the second bonding area at the circuit contact layer 401, the base layer 400, and the middle layer 6 is placed at the same position, the adhesive can adhere the electric vibrator 3, the circuit-board 4, the backing layer 5, and the middle layer 6 at one time. Thereby the ultrasound probe 100 can be built-up much easier.

As described in the first to third embodiments above, further the second bonding area is implemented to at least the circuit contact layer 401. The position of the second bonding area, however, can be varied.

For example, the second bonding area can be placed at the base layer 400, not at the contact layer 401. In this case, the through-hole acts as the second bonding area that reaches the surface of the backing layer 5 and the surface of the electric vibrator 3.

Figure 10A:
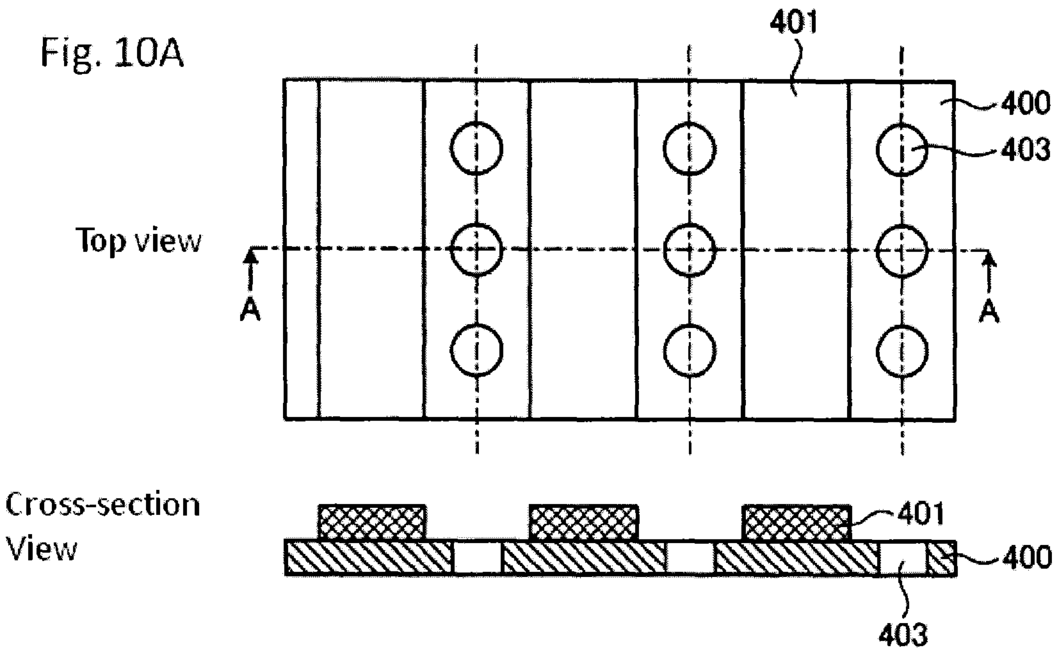
FIGS. 10A, 10B are a cross-section diagram of electric vibrators, a circuit-board, the contact-layers, and backing layers according to a fourth embodiment.
Figure 10B:
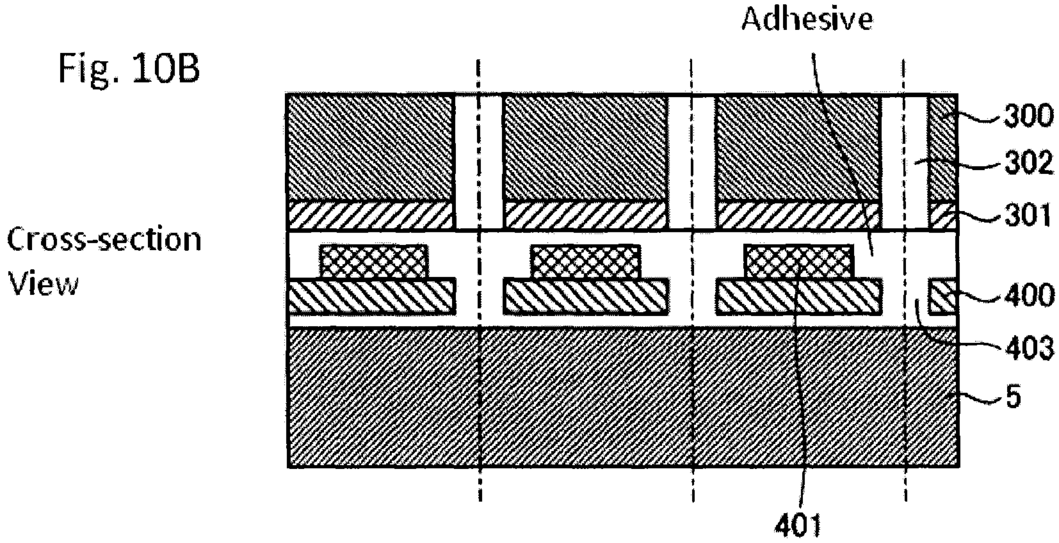

FIGS. 10A, 10B show a structure of the base layer 400 in a fourth embodiment. FIG. 1 OA shows a top view and a cross-section diagram that represents the base layer 400 with the circuit contact layer 401. FIG. 10B is a cross-section diagram that represents the base layer 400 with the circuit contact layer 401, the vibrating layer 300 with the vibrator contact layer 301, and the backing layer 5. As shown in FIG. 10A, the through-hole 403 is implemented between the patterned circuit contact layer 401, and the through-hole 403 acts as the second bonding area. For example, the through-hole 403 has a 0.3 mm diameter, and the through-holes 403 are placed at a 0.5 mm pitch.

As shown in FIG. 10B, the adhesive can be provided around the base layer 400 with the circuit contact layer 401. Thus the adhesive can more surely adhere the electric vibrator 3, the circuit-board 4, and the backing layer 5 at one time. The structure of FIG. 10B allows increasing an amount of the adhesive, compared to the structure shown in FIG. 4B as a background art.

After injecting the adhesive and placing the electric vibrator 3 on the circuit-board 4, the die cutting procedure is applied to the electric vibrator 3, and thereby the bulk electric vibrator 3 is divided into the vibrator cells. Strips made by the die cutting procedure reach the bottom surface of the electric vibrator 3. That is, the adhesive that flows around the circuit board 4 is not removed by the die cutting procedure, and can keep a secure bonding.

The structure of the first and second bonding area in the fourth embodiment can be applied to a laminated circuit contact layer 401. In this case, the through-hole 403 is implemented not only in the base layer 400, but also in the circuit contact layer 401. After implementing the through-hole 403, injecting the adhesive, and placing the electric vibrator 3 on the circuit-board 4, the die cutting procedure is applied to the electric vibrator 3. Strips made by the die cutting procedure reach the upper surface of the base layer 400. If the through-hole 403 is too big, the through-hole 403 can cause a loss of electric connection of the circuit contact layer 401. But a shape of the through-hole 403 and a number of the through-hole 403 can be varied, for example the through-hole 403 can have a circular shape, a rectangular shape, a polygonal shape, an elliptical shape, etc.

Figure 11A:
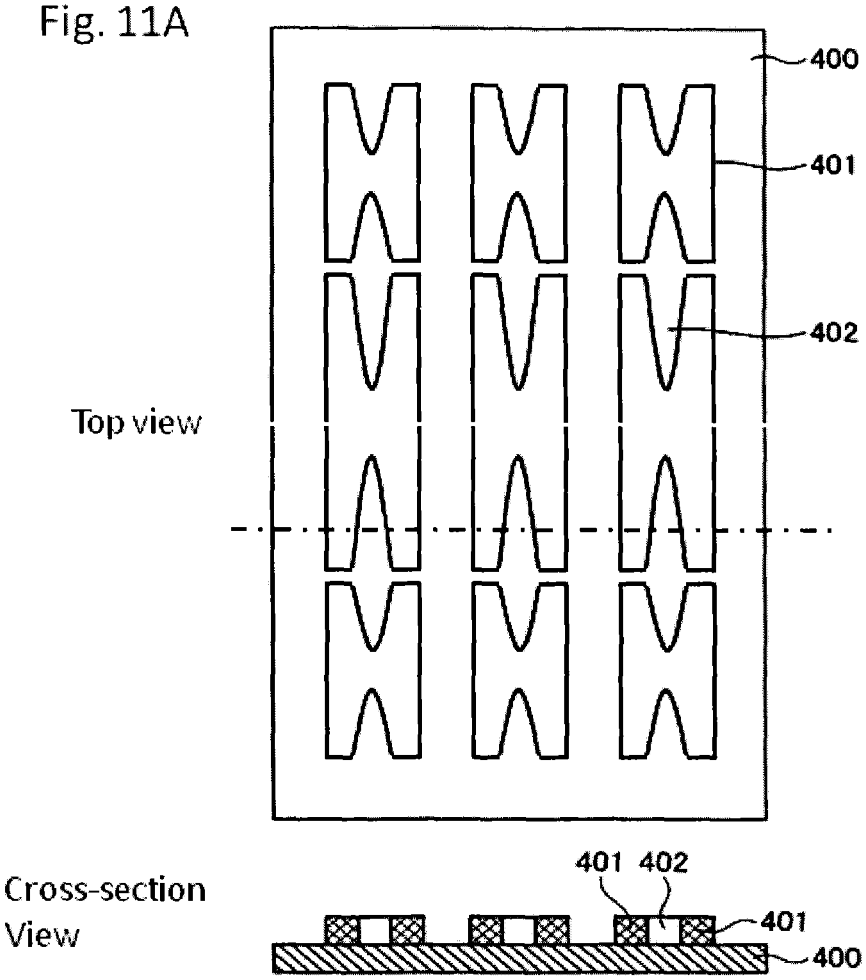
FIGS. 11A, 11B are a top view and a cross section diagram of electric vibrators and a circuit-board according to a fifth embodiment.
Figure 11B:
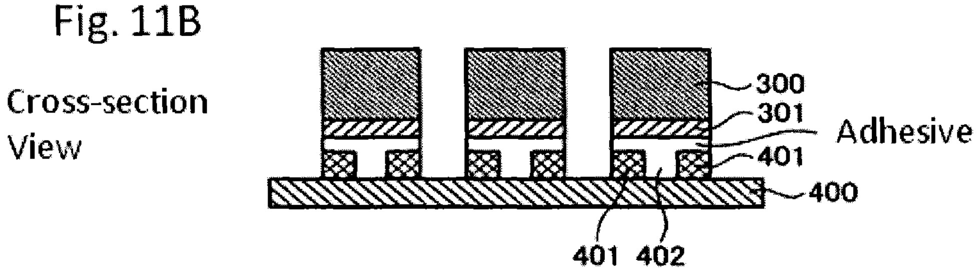

As described in the first to fourth embodiments, one separated vibrator cell has one patterned circuit contact layer 401. But the number of the patterned circuit contact layers 401 per one vibrator cell can be increased. A plurality of the patterned circuit contact layers 401 that are separated electrically can be attached to one separated vibrator cell. FIG. 11A shows a top view and a cross-section diagram of the base layer 400 and the circuit contact layer 401. The cross-section diagrams of FIGS. 11A and 11B represent the cross-section at the chain line in the top view of FIG. 11A. As shown in FIG. 11A, three patterned circuit contact layers 401 are implemented for one vibrator cell. The three patterned circuit contact layers 401 are placed separately, so the adhesive can be provided into gaps of the circuit contact layers 401. The adhesive can thus more surely adhere the base layer 400 and the vibrator contact layer 301. That is, the gap between the circuit contact layers 401 acts as the second bonding area. Also, each of the patterned circuit contact layers 401 can have a cleavage at one edge of the circuit contact layer 401. The cleavages can also act as the second bonding area. In the fifth embodiment, the gap and the cleavages of the circuit contact layer 401 can act as the second bonding area. The adhesive that flows into the second bonding area can more surely adhere the base layer 400 and the vibrator contact layer 301. The number of the circuit contact layer 401 per one separated vibrator cell and the shape of the circuit contact layer 401 can be varied. The gap between the circuit contact layers 401 can be implemented orthogonal to the scan direction, and the number of the gaps can be increased.

As described in the fifth embodiment, three circuit contact layers 401 connect to one vibrator cell. In this case, any area of transmitting and receiving can be varied by controlling an electric connection with the three circuit contact layers 401. For example, when the transmitting signals from the body 200 are provided to all three circuit contact layers 401, the vibrator cell transmits the ultrasound wave from the whole surface of the vibrator cell. On the other hand, when the transmitting signals from the body 200 are provided to the central circuit contact layer 401 only, the vibrator cell transmits the ultrasound wave from the center surface of the vibrator cell. In the same manner to transmit, when the body 200 receives the receiving signals from all of three circuit contact layer 401, the vibrator cell can receive the ultrasound waves from the whole surface of the vibrator cell. On the other hand, when the body 200 receives the ultrasound wave from the central circuit contact layer 401 only, the vibrator cell can receive the ultrasound waves from central surface of the vibrator cell only.

The above embodiments can be applied to a 1-D ultrasound probe. The above embodiments can be also applied to a mechanical 1-D ultrasound probe and a 2-D ultrasound probe.

As described above, with the described embodiments, the ultrasound probe 100 can stably maintain the electric vibrator 3 and the circuit-board 4 by using second the bonding area.

The present invention is not limited to the above embodiments, and constituent elements can be variously modified and embodied at the execution stage within the spirit and scope of the invention. In addition, various inventions can be formed by proper combinations of a plurality of constituent elements disclosed in the above embodiments. For example, several constituent elements may be omitted from all the constituent elements disclosed in the above embodiments. Furthermore, constituent elements in the different embodiments may be properly combined.

The invention claimed is:

1. An ultrasound probe, comprising:

an electric vibrator including a vibrator contact layer, to transmit and receive ultrasound waves; and a circuit-board including a circuit contact layer connected to the vibrator contact layer, to transmit and receive ultrasound signals via the vibrator contact layer, wherein a maximum width of the circuit contact layer, which width is an extent of a shorter side of the circuit contact layer, is a width of the electric vibrator, the circuit contact layer includes a bonding area that extends to a surface of a circuit-board and a surface of the vibrator contact layer, an adhesive is provided in the bonding area to adhere the electric vibrator and the circuit-board to each other, the bonding area includes a through-hole in the circuit contact layer, and the through-hole in the circuit contact layer extends to the surface of the circuit-board and the surface of the vibrator contact layer.

2. An ultrasound probe, comprising:

an electric vibrator including a vibrator contact layer, to transmit and receive ultrasound waves; and a circuit-board including a circuit contact layer connected to the vibrator contact layer, to transmit and receive ultrasound signals via the vibrator contact layer, wherein a maximum width of the circuit contact layer, which width is an extent of a shorter side of the circuit contact layer, is a width of the electric vibrator, the circuit contact layer includes a bonding area that extends to a surface of a circuit-board and a surface of the vibrator contact layer, an adhesive is provided in the bonding area to adhere the electric vibrator and the circuit-board to each other, the bonding area includes a cleavage implemented at an edge of the circuit contact layer, the cleavage extends to the surface of the circuit-board and the surface of the vibrator contact layer.

3. An ultrasound probe according to claim 2, wherein the circuit contact layer includes two of the cleavages at opposite edges of the circuit contact layer.

4. An ultrasound probe according to claim 1, further comprising:

a backing layer attached to the circuit-board, to absorb ultrasound waves from the electric vibrator, wherein the bonding area includes a through-hole in the circuit-board, and the through-hole in the circuit-board extends to the surface of the vibrator contact layer and a surface of the backing layer.

5. An ultrasound probe according to claim 4, wherein the through-hole in the circuit contact layer and the through-hole in the circuit-board are located at a same position.

6. An ultrasound probe according to claim 1, further comprising:

a middle layer between the electric vibrator and the circuit-board to absorb the ultrasound waves, wherein the bonding area includes a through-hole that extends to the surface of the vibrator contact layer and the surface of the circuit-board across the middle layer.

7. An ultrasound probe, comprising:

an electric vibrator including a vibrator contact layer, to transmit and receive ultrasound waves; and a circuit-board including a circuit contact layer connected to the vibrator contact layer, to transmit and receive ultrasound signals via the vibrator contact layer, wherein a maximum width of the circuit contact layer, which width is an extent of a shorter side of the circuit contact layer, is a width of the electric vibrator, the circuit contact layer includes a bonding area that extends to a surface of a circuit-board and a surface of the vibrator contact layer, an adhesive is provided in the bonding area to adhere the electric vibrator and the circuit-board to each other, a plurality of the circuit contact layers are connected to the electric vibrator, and the bonding area includes a gap between the plurality of the circuit contact layers.

8. An ultrasound probe according to claim 7, wherein each of the circuit contact layers includes cleavages implemented at an edge of the circuit contact layer, the cleavages reach the surface of the circuit-board and the surface of the vibrator contact layer.

9. An ultrasound probe according to claim 8, wherein each of the circuit contact layers includes two of the cleavages at opposite edges of the circuit contact layer.

* * * * *